US007238262B1

(12) United States Patent
Bartolomei et al.

(10) Patent No.: US 7,238,262 B1
(45) Date of Patent: Jul. 3, 2007

(54) SYSTEM AND METHOD OF COATING SUBSTRATES AND ASSEMBLING DEVICES HAVING COATED ELEMENTS

(75) Inventors: Leroy A. Bartolomei, Sanata Rosa, CA (US); H. Robert Gray, Sebastopol, CA (US)

(73) Assignee: Deposition Sciences, Inc., Santa Rosa, CA (US)

( * ) Notice: Subject to any disclaimer, the term of this patent is extended or adjusted under 35 U.S.C. 154(b) by 0 days.

(21) Appl. No.: 09/537,095

(22) Filed: Mar. 29, 2000

(51) Int. Cl.
*C23C 16/00* (2006.01)
*C23C 14/35* (2006.01)

(52) U.S. Cl. .......................... 204/192.26; 204/192.27; 204/192.28; 427/107; 427/111; 427/126.2; 427/165; 427/166; 427/372.2

(58) Field of Classification Search ........... 204/192.26, 204/192.27, 192.28; 427/106, 107, 111, 427/126.2, 165, 166, 167, 372.2; 313/112, 313/115

See application file for complete search history.

(56) References Cited

U.S. PATENT DOCUMENTS 3,295,909 A * 1/1967 Hollenbeck .................... 445/4
3,462,209 A * 8/1969 Fridrich ....................... 445/27
3,466,489 A * 9/1969 Huston Jr. et al. .......... 313/579
3,777,171 A * 12/1973 Hollenbeck ............ 250/559.45
3,932,780 A * 1/1976 DeCaro et al. ............. 313/113
4,663,557 A * 5/1987 Martin et al. ............... 313/112
4,949,005 A * 8/1990 Parham et al. .............. 313/112
4,959,585 A * 9/1990 Hoegler et al. ............. 313/271
5,055,740 A 10/1991 Sulcs
5,221,352 A * 6/1993 Terneu et al. ............... 118/718
5,276,763 A * 1/1994 Gobel et al. ................ 392/422
5,505,648 A 4/1996 Nagasawa
5,506,471 A 4/1996 Kosmatka et al.
5,536,991 A * 7/1996 Parham et al. .............. 313/113
5,618,388 A 4/1997 Seeser
5,848,162 A 12/1998 Bartolomei et al.
5,879,519 A 3/1999 Seeser et al.
5,923,471 A 7/1999 Wood, II et al.
6,382,816 B1 * 5/2002 Zhao et al. ................. 362/257

* cited by examiner

*Primary Examiner*—Rodney G. McDonald
(74) *Attorney, Agent, or Firm*—Duane Morris, LLP

(57) ABSTRACT

A system and method of coating curved substrates and assembling devices having coated elements. The system and method are of particular utility in the manufacture of lamps having a coating formed on the hermetically sealed light emitting chamber of the lamp. The system and method includes, inter alia, an improved uniform coating process and apparatus, improved throughput in the coating process, a reduction in bad coating losses, improved baking processes, and an improved method and apparatus for aligning the filament of a halogen lamp achieved by performing the step of coating of the light emitting chamber prior to the step of sealing the chamber.

28 Claims, 13 Drawing Sheets

SYSTEM AND METHOD OF COATING SUBSTRATES AND ASSEMBLING DEVICES HAVING COATED ELEMENTS

BACKGROUND OF THE INVENTION

The present invention relates to the fields of forming coatings on substrates and assembling devices having coated elements.

The deposition of materials to form coatings on curved substrates is well known and finds utility, for example, in the manufacture of lamps. In the manufacture of lamps, particularly lamps which include a hermetically sealed light emitting chamber (i.e., a lamp burner) such as halogen lamps or high intensity discharge ("HID") lamps, it is often desirable to deposit one or more materials to form a coating on at least a portion of the surface of the lamp burner. For example, it is well known to deposit materials such as infrared reflecting ("IRR") material, ultraviolet reflecting material, heat reflecting material, and visible spectrum radiation reflecting material to form coatings on the surface of lamp burners.

A known method of manufacturing lamps having a coating formed on at least a portion of the surface of the lamp burner includes the sequential steps of (i) providing a lamp burner envelope formed from a generally tubular section of light transmitting material; (ii) positioning one or more electrical leads so that each lead provides an electrical connection from the interior of the light emitting chamber to the exterior of the chamber; (iii) sealing the lamp burner envelope to hermetically seal the burner envelope to the leads to thereby seal the light emitting chamber; and then (iv) depositing one or more materials to form a coating on at least a portion of the surface of the lamp burner.

There are many disadvantages in this method of manufacturing such lamps due to the sequence of the steps of (a) sealing the lamp burner and (b) forming the coating on the sealed lamp burner. Some of the disadvantages result from the difficulty of uniformly depositing the material or materials on the elongated shape and generally circular cross-section of the lamp burners, a process which requires the rotation of each individual lamp burner about its longitudinal axis from the outside once the leads are installed and the ends of the burner are sealed. Other disadvantages include the limited throughput in the deposition process as a result of the amount of area occupied by the carrier required to hold and rotate each lamp burner. Still other disadvantages result from the limitation on the temperature of the reactive process caused by the presence of the elements of the burner other than the envelope. Further disadvantages result from the inability to test the quality of the coating before the coated substrate is used in additional manufacturing steps, e.g., the time and expense of completing the burner before discovering a defective coating results in the loss of the entire burner rather than the relatively inexpensive, defectively coated burner envelope. Still other disadvantages result from the inability to use the coating to facilitate other manufacturing steps such as the positioning of the leads within the envelope in the aligning and sealing process.

With respect to the difficulty in obtaining uniform deposition, the processes used to form coatings on substrates such as lamp burners include chemical vapor deposition ("CVD") and sputter deposition. One prior art method and apparatus for forming a coating on substrates by sputter deposition is disclosed in U.S. Pat. No. 5,849,162 to Bartolomei et al., the content of which is incorporated herein by reference. In the Bartolomei et al. process, one or more substrates are supported by a carrier and carried past one or more sources of the material or materials to be deposited, e.g., sputtering targets in a sputter deposition process, by a rotating drum or a linearly transported planar surface.

It is desirable that the materials deposited on the surface of the lamp burner form a coating which possesses uniform physical characteristics throughout the coated surface about the circumference of the lamp burner. In this way the physical characteristics of the coating on any one portion of the surface of the lamp burner are the same as the physical characteristics of the coating on the other portions of the surface of the lamp burner.

A known process for uniformly coating elongated objects having a generally circular cross-section, here described in connection with the coating of lamp burners, includes the steps of (a) supporting an array of the lamp burners on a carrier (such as a cylindrical drum or planar surface as disclosed in Bartolomei et al.); (b) rotating each lamp burner in the array about its longitudinal axis; and (c) carrying the rotating array past one or more sources of the material or materials to be deposited. By rotating each lamp burner about its longitudinal axis while depositing the material or materials on the selected portions of the surface of the lamp burner to form the coating, each portion of the circumference of the lamp burner the material or materials deposited may be uniformly deposited about the circumference of each lamp burner thus providing uniformity in the physical characteristics of the coating about the entire coated surface of the lamp burner.

The mounting of each end of each lamp burner in the array to a mechanical means for rotating the burner requires redundant, complex and expensive tooling in the coating apparatus. In one aspect, it is an object of the present invention to provide a novel coating method and apparatus for forming a uniform coating on an array of lamp burner envelopes which requires less complex and thus less expensive tooling for the rotation of each lamp burner or other substrate about its longitudinal axis during the coating process. This and other objects may be achieved by the novel apparatus and method for rotating a plurality of lamp burner envelopes about the longitudinal axis thereof while moving the envelopes past one or more sputtering sources.

With regard to the throughput of the deposition process, it is desirable to maximize the throughput by maximizing the number of substrates which may be mounted on the carrier. It is common in known processes for each individual substrate rotation means to require more space on the carrier than the individual substrate. Because each substrate is mounted on an individual axial rotation means, the maximum density of the array of lamp burners which may be carried per surface area of the carrier is severely limited. In another aspect, it is an object of the present invention to provide a novel method and apparatus for forming a coating on an array of substrates with significantly improved throughput.

With respect to temperature limitations, it is often desirable to coat substrates using a reactive coating method such as disclosed in the aforementioned Bartolomei et al. patent. In that process, a material such as silicon is deposited and reacted with a gas such as oxygen so that the coating on the surface of the substrate comprises silicon dioxide, a reaction which generally occurs more readily at higher temperatures. While the temperature at which the reactive coating is deposited on the substrate in a reactive sputter deposition process is generally within the range of 25° C. to 125° C. and is limited to about 200° C. or below, the time required to form a completely reacted coating on a substrate may be reduced by depositing the coating material or materials at a rate in excess of the rate at which all of the deposited materials will be reacted with the reactive gas in the reactive coating apparatus, and thereafter removing the substrates from the reactive coating apparatus for baking in a reactive atmosphere at temperatures greater than the temperature of the deposition process. The elevation of temperature in the baking process reduces the total time required to obtain a fully reacted coating on a substrate and thus improves the efficacy of the coating process. Generally, the amount of time required to complete the reaction is inversely related to the baking temperature, and the uniformity of the coating is generally enhanced by higher baking temperatures.

However, the temperature of the baking process may be significantly limited by the non-substrate components being baked. Where, for example, electrical leads and other components of a completed lamp burner are present, such electrical leads will be damaged if exposed to high temperatures in a reactive atmosphere such as air which contains a significant amount of oxygen. For example, the baking temperature of a lamp burner having tungsten and molybdenum electrical leads must be limited to less than about 400° C. in an atmosphere comprising essentially of normal dry air to prevent damage to the electrical leads due to oxidation of the leads. Thus, the baking temperature of the lamp burners must be limited to prevent damage to the leads, and this limits the advantage of the baking process.

In another aspect, it is an object of the present invention to provide a novel method and apparatus for manufacturing lamps which avoids the baking temperature limitation imposed by the inclusion of non-substrate components in the device coated. In other aspects, it is an object of the present invention to provide to provide a novel method of baking coated lamp burner envelopes.

With respect to the losses associated with the defective coating of completed products, there will be "bad coating losses" in any coating process in which the coating is of unacceptable quality. Yet another disadvantage of performing additional manufacturing steps before the substrate is coated results in the loss of the entire lamp burner, including the components used as well as the time and expense incurred in performing the additional manufacturing steps. In lamp burners, for example, the electrical leads and the time positioning the leads and sealing the lamp burner envelopes represents a significant expense. Where the quality of the coating can be tested before any additional manufacturing steps are performed, the loss from a defective coating is limited to the substrate. In another aspect, it is an object of the present invention to provide a novel method and apparatus for manufacturing coated substrates in which the cost of bad coating losses is significantly reduced.

In the manufacture of certain products such as halogen lamps having a filament, it is known that an IRR coating on at least a portion of the surface of the halogen lamp burner improve the operating efficiency of the lamp, i.e., the IRR coating reflects the infrared radiation emitted in the light emitting chamber back toward the filament to raise the temperature of the filament and thereby reduce the power necessary to operate the lamp. The position of the filament relative to the lamp burner envelope is critical in optimizing the advantage in operating efficiency of the lamp from the use of an IRR coating on the lamp burner. Where the burner is assembled prior to coating, the existence of the IRR coating is not available in determining the optimum position of the filament. Known methods require the use of time consuming and complex apparatus to optically and mechanically position the filament prior to hermetically sealing the burner envelope to the leads. In yet another aspect, it is an object of the present invention to provide a novel method and apparatus for determining the optimum position of the filament of a halogen lamp relative to the lamp burner envelope. In other aspects, the methods and apparatus of the present invention are low in cost and easy to perform, facilitated by measuring the electrical resistance of the filament, and facilitated by measuring the power applied to the filament to maintain a constant temperature of the filament.

Where many of the disadvantages of completing the device prior to its coating are obviated by coating of the substrate prior to the further manufacturing steps, it becomes important to protect the coating from damage during the further manufacturing steps.

Where the substrate is coated prior to the additional manufacturing steps, there is the possibility of damage to the coating in the further manufacturing steps. For example in the manufacture of lamps where the lamp burner envelope is formed from glass or quartz, the step of hermetically sealing the burner envelope to the electrical leads includes the pinching of portions of the lamp burner envelope which have been raised to about 1700° C.–2000° C. Where the lamp burner envelope is formed from ceramic material, the step of hermetically sealing the burner envelope to the electrical leads includes the melting of a frit by raising its temperature to about 1700° C. Such temperatures may damage the coating. In another aspect, it is an object of the present invention to provide a method and apparatus for preventing damage to the coating formed on a lamp burner envelope during the sealing of the envelope. In additional aspects, this object may be realized by mechanical shielding and by a novel protective coating to both prevent damage to the IRR coating during the sealing of the lamp burner envelope and reduce the loss of infrared radiation during the operation of the lamp.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The present invention relates to the deposition of materials on substrates to form coatings and finds utility in the manufacture of lamps wherein a coating is formed on at least a portion of the surface of the lamp burner. The present invention relates generally to the manufacture of lamps but for convenience will be described with reference to the manufacture of halogen lamps and HID lamps.

It is well known to make halogen or HID lamps having a coating formed on a portion of the surface of the lamp burner. Such lamps are typically made by the sequential steps of (i) forming the lamp burner envelope from a generally tubular section of light transmitting material, (ii) positioning electrical leads and/or electrodes relative to the lamp burner envelope, (iii) hermetically sealing the burner envelope to the electrical leads to thereby seal the light emitting chamber of the lamp, and (iv) forming a coating on a portion of the surface of the lamp burner.

Figure 1A:
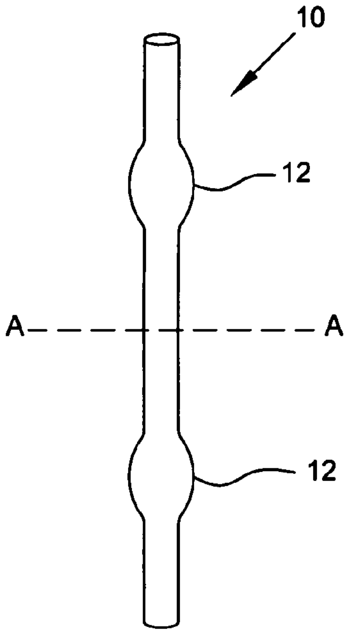
FIG. 1*a* is a front pictorial view of a portion of a generally tubular section from which halogen lamp burner envelopes may be formed.
Figure 1B:
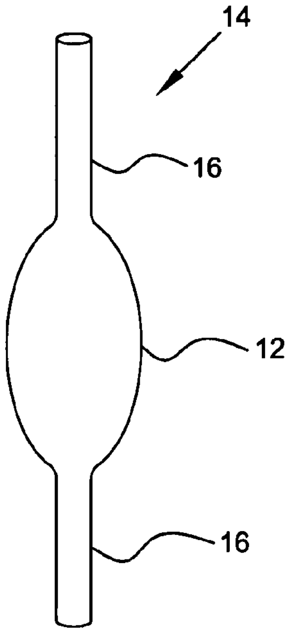
FIG. 1*b* is a front pictorial view of a halogen lamp burner envelope.

FIG. 1*a* illustrates a portion of a generally tubular section 10 of light transmitting material from which the lamp burner envelopes for halogen lamps may be formed. With reference to FIGS. 1*a* and 1*b*, the section 10 may comprise light transmitting material such as glass, quartz glass, or ceramic and may include bulbous portions 12 spaced apart along its length. The section 10 may be cut between the bulbous portions 12 such as at line A—A to form the individual halogen lamp burner envelopes such as shown in FIG. 1*b* with a bulbous portion 12 and end portions 16.

Figure 2A:
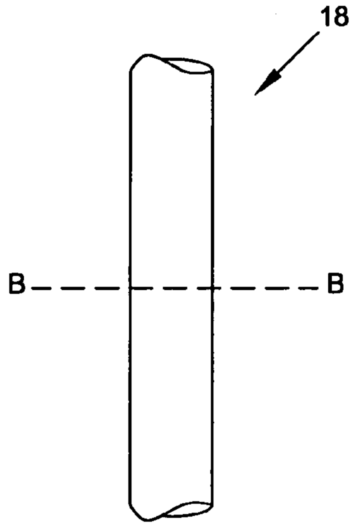
FIG. 2*a* is a front pictorial view of a portion of a generally tubular section from which HID lamp burner envelopes may be formed.
Figure 2B:
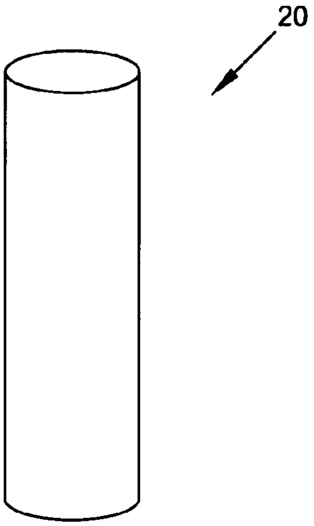
FIG. 2*b* is a front pictorial view of an HID lamp burner envelope from which a pinched body arc tube may be formed.
Figure 2C:
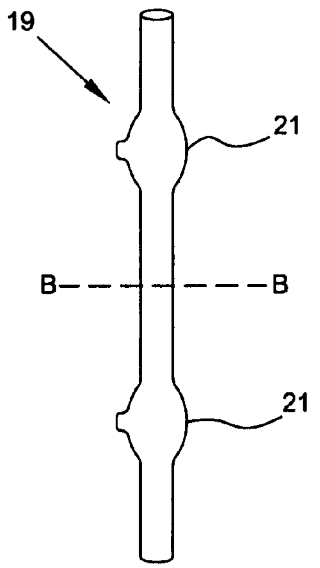
FIG. 2*c* is a front pictorial view of a portion of a generally tubular section from which HID lamp burner envelopes may be formed.
Figure 2D:
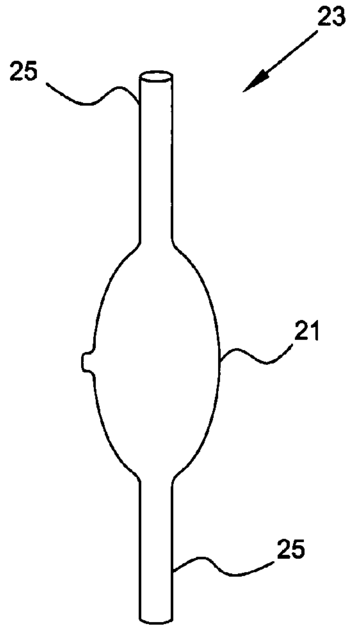
FIG. 2*d* is a front pictorial view of an HID lamp burner envelope from which a formed body arc tube may be formed.

FIGS. 2*a* and 2*c* each illustrate a portion of a generally tubular section 18,19 of light transmitting material such as glass, quartz glass, or ceramics from which the lamp burner envelopes for HID lamps having a pinched body arc tube and a formed body arc tube respectively may be formed. With reference to FIGS. 2*a* and 2*c*, the section 18 may be cut transversely to its length at predetermined locations such as at line B—B to form individual HID lamp burner envelopes as illustrated in FIG. 2*b*. The section 19 includes bulbous portions 21 spaced apart along its length and may be cut along the portions of the section 19 between the bulbous portions 21 such as at line B—B to form the individual lamp burner envelopes. FIG. 2*d* illustrates an individual HID lamp burner envelope 23 from which a formed body arc tube including a bulbous portion 21 and end portions 25 may be formed.

In one aspect of the present invention, a novel method of manufacturing lamps lamps having a coating formed on the surface of the lamp burner is provided wherein the step of forming the coating is performed by forming the coating on the surface of the sections 10,18,19 before cutting the sections 10,18,19 to form the individual lamp burner envelopes 14,20,23.

Figure 3:
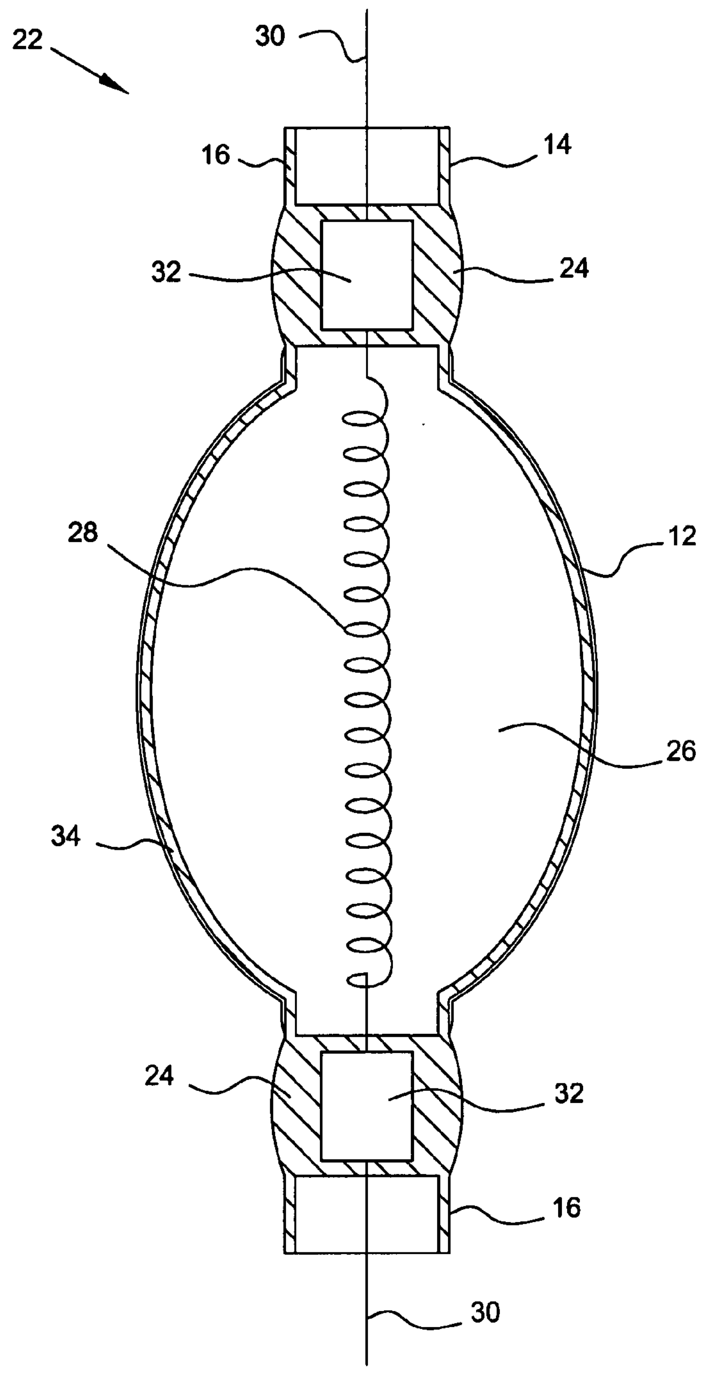
FIG. 3 is a schematic representation of a prior art halogen lamp burner in longitudinal cross-section in the plane of the pinch seals.

FIG. 3 illustrates a lamp burner 22 for a halogen lamp. As illustrated in FIG. 3, the halogen lamp burner 22 comprises a generally tubular lamp burner envelope 14 having a bulbous portion 12 and end portions 16. The lamp burner envelope 14 may be formed from glass or quartz glass and pinch sealed or the lamp burner envelope 14 may be formed from ceramic material and frit sealed.

In the disclosed embodiment, the lamp burner envelope 14 is formed from a material such as glass or quartz glass. A coating 34 is formed on a portion of the exterior surface of the lamp burner envelope 14 and a filament 28 is positioned within the chamber 26. Each end portion 16 includes a pinch seal 24 to hermetically seal the light emitting chamber 26 from the exterior of the burner envelope 14. A foil 32 may be sealed in each pinch seal 24 to provide an electrical connection between the filament 28 and the lead wires 30, thereby providing electrical connections from the interior of the chamber 26 to the exterior of the lamp burner 22.

Figure 4:
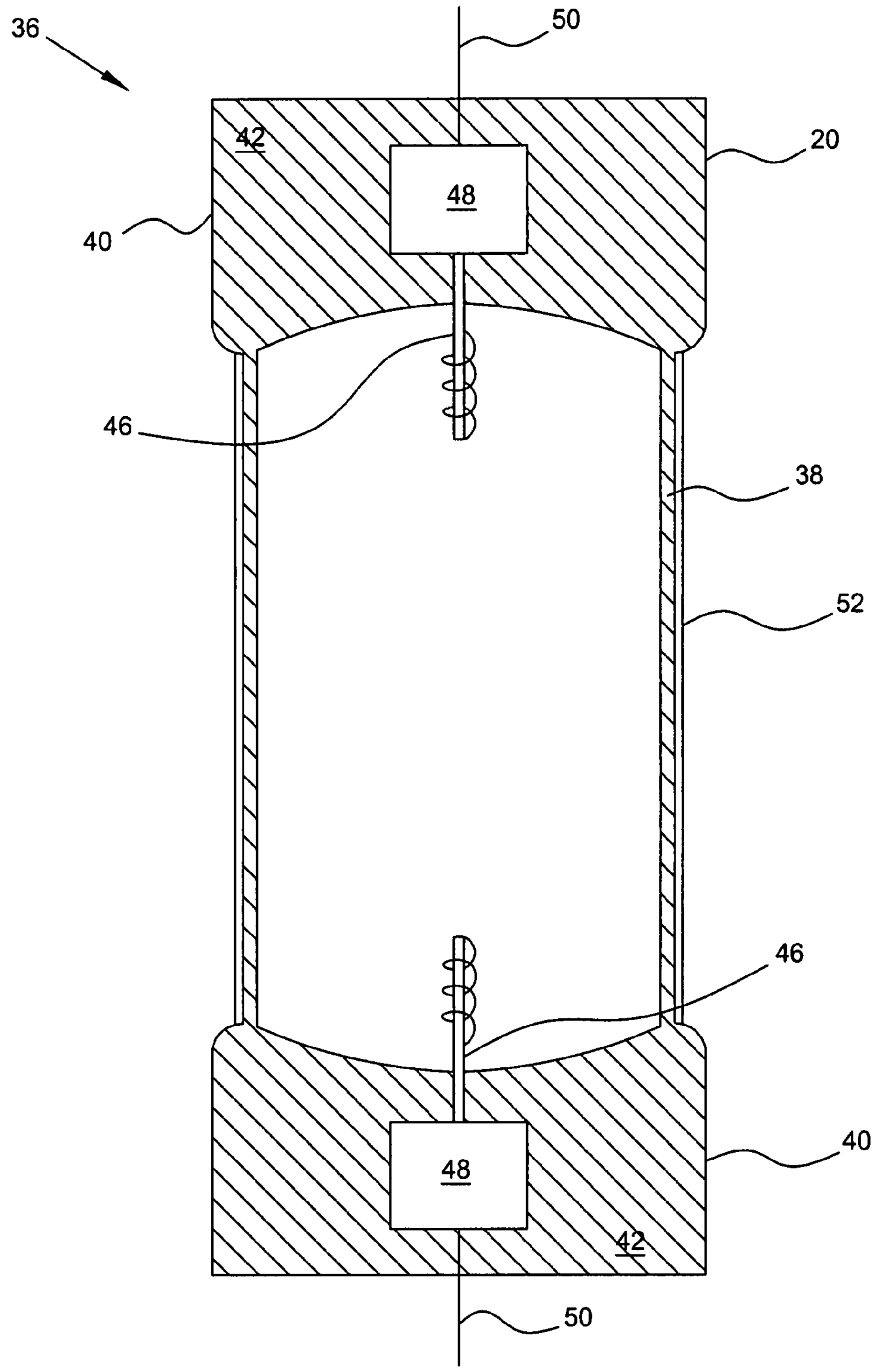
FIG. 4 is a schematic representation of a prior art pinched body arc tube in longitudinal cross-section in the plane of the pinch seals.

FIG. 4 illustrates a lamp burner 36 for an HID lamp having a pinched body arc tube. As shown in FIG. 4, the HID lamp burner 36 (i.e., arc tube) comprises a generally cylindrical lamp burner envelope 20 having a central portion 38 and flattened end portions 40. The lamp burner envelope 20 is formed from a material such as glass or quartz glass and a coating 52 is formed on at least a portion of the exterior surface of the burner envelope 20. Each end portion 40 is flattened to form a pinch seal 42 to hermetically seal a light emitting chamber 44 from the exterior of the lamp burner envelope 20. The electrodes 46 are positioned at each end of the chamber 44 and a foil 48 is sealed in each pinch seal 42 to provide an electrical connection between one of the electrodes 46 and a lead wire 50, thereby providing an electrical connection from the interior of the chamber 44 to the exterior of the lamp burner 36.

It is an important aspect of the present invention that the coating be formed on the lamp burner envelope 14,20 before the steps of completion of the manufacture of the burner by positioning the electrical leads 28,30 or 46,50 and by sealing the lamp burner envelope 14,20 to the electrical leads.

Obtaining Uniform Coatings and Process Throughput:

In the manufacture of lamps, it is desirable that the coating 34,52 possess uniform characteristics about the circumference of the burner envelope 14,20. This is achieved in known methods by the movement of an array of lamp burners 22 past one or more sources of the material or materials to be deposited, while rotating each lamp burner 22 about its longitudinal axis.

Figure 5:
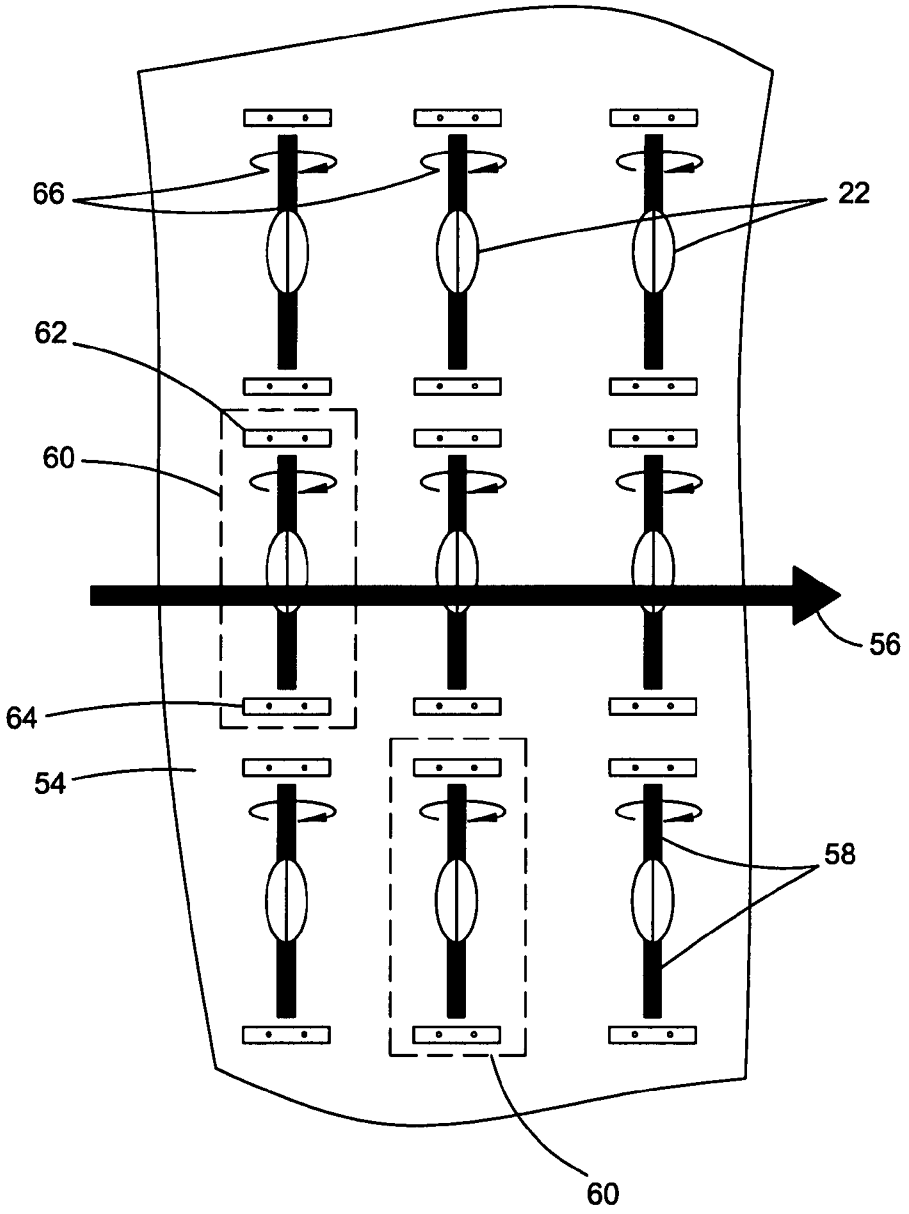
Fig. 5 (Prior Art)
FIG. 5 is a schematic representation of a portion of a prior art carrier illustrating individual lamp burners supported thereon.

FIG. 5 shows a portion of a prior art carrier having an array of lamp burners supported thereon. The surface of the portion of the carrier 54 illustrated in FIG. 5 may be a flat surface which moves the lamp burners linearly past the sources of deposition material in an in-line sputter deposition process, or may be the cylindrical surface of a drum which moves the lamp burners past the sources of deposition material as the drum rotates about its longitudinal axis in a batch sputter deposition process.

Figure 6:
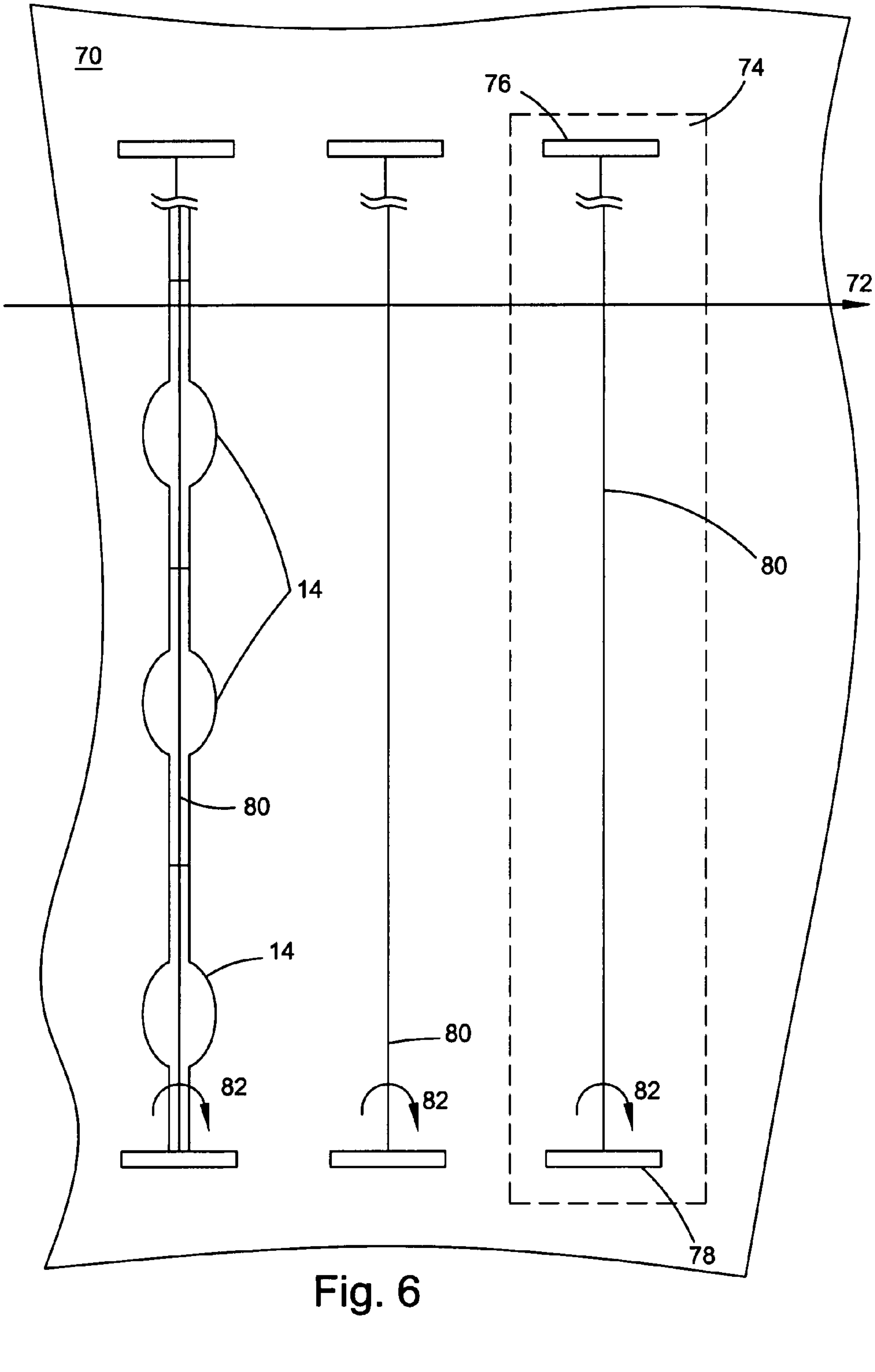
FIG. 6 is a schematic representation of a portion a carrier of one embodiment of the coating apparatus of the present invention illustrating lamp burner envelopes supported thereon.

With reference to FIG. 5, the halogen lamp burners 22 are supported on the portion of the carrier 54 which carries the lamp burners 22 in the direction of arrow 56. Each individual lamp burner 22 is supported at each end 58 by an individual axial rotation means 60 which includes supports 62,64 and a means (not shown) to rotate the lamp. Each axial rotation means 60 rotates the lamp burner 22 supported thereon about the longitudinal axis of the lamp burner 22 in the direction shown by arrows 66. The means to support and to rotate the individual burners requires complex and expensive tooling and, as is apparent from FIG. 5, the number of lamp burners 22 supported on the carrier 54 is limited by the number of supports 60 which may be carried by the carrier 54. This significantly limits the throughput of the coating process.

Where the step of forming the coating is performed before the steps of positioning the electrical leads and sealing the lamp burner envelopes, the density of the burners on the carrier and the throughput of the system are significantly enhanced. For example, FIG. 6 shows a portion of a carrier moving an array of lamp burner envelopes 14 in the direction of the arrow 72 past one or more sources of deposition material (not shown). As illustrated, several lamp burner envelopes 14 are supported on a single axial rotation means 74 which may include the supports 76,78 and a rod 80 attached thereto. Any suitable conventional means (not shown) may be used to rotate the rod 80 about its longitudinal axis in the direction of the arrow 82. Because the ends of the lamp burner envelopes 14 are not sealed, the lamp burner envelopes 14 may be internally supported on the rod 80 such that rotation of the rod 80 will rotate all of the lamp burner envelopes 14 supported thereon.

Figure 7:
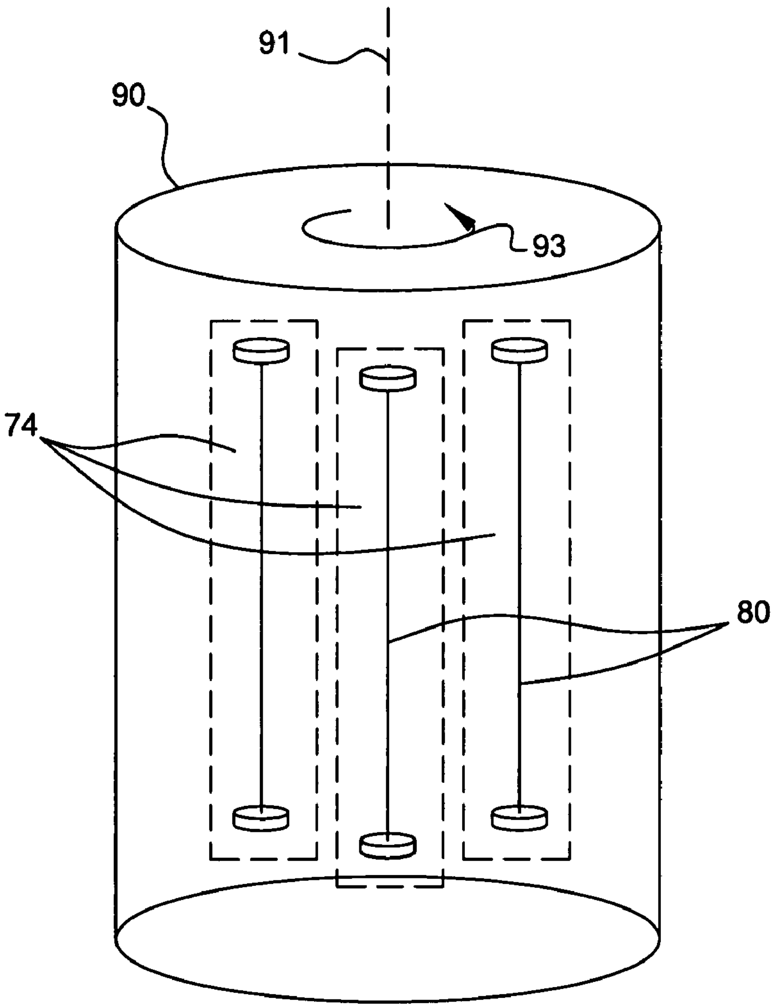
FIG. 7 is a schematic representation of a cylindrical carrier of one embodiment of the coating apparatus of the present invention illustrating a plurality of axial rotation means supported thereon.

The axial rotation means 74 may be carried by a generally planar carrier in an in-line sputter deposition process or by a generally cylindrical carrier (i.e. drum) in a batch sputter deposition process. FIG. 7 illustrates a preferred embodiment of the drum in a batch sputter deposition apparatus wherein the rotational axis of the drum is vertical and the drum 90 rotates about its vertical longitudinal axis 91 in the direction shown by arrow 93. One or more axial rotation means 74 may be carried by the drum 90 spaced around the circumference thereof with the rods 80 vertical.

Figure 8:
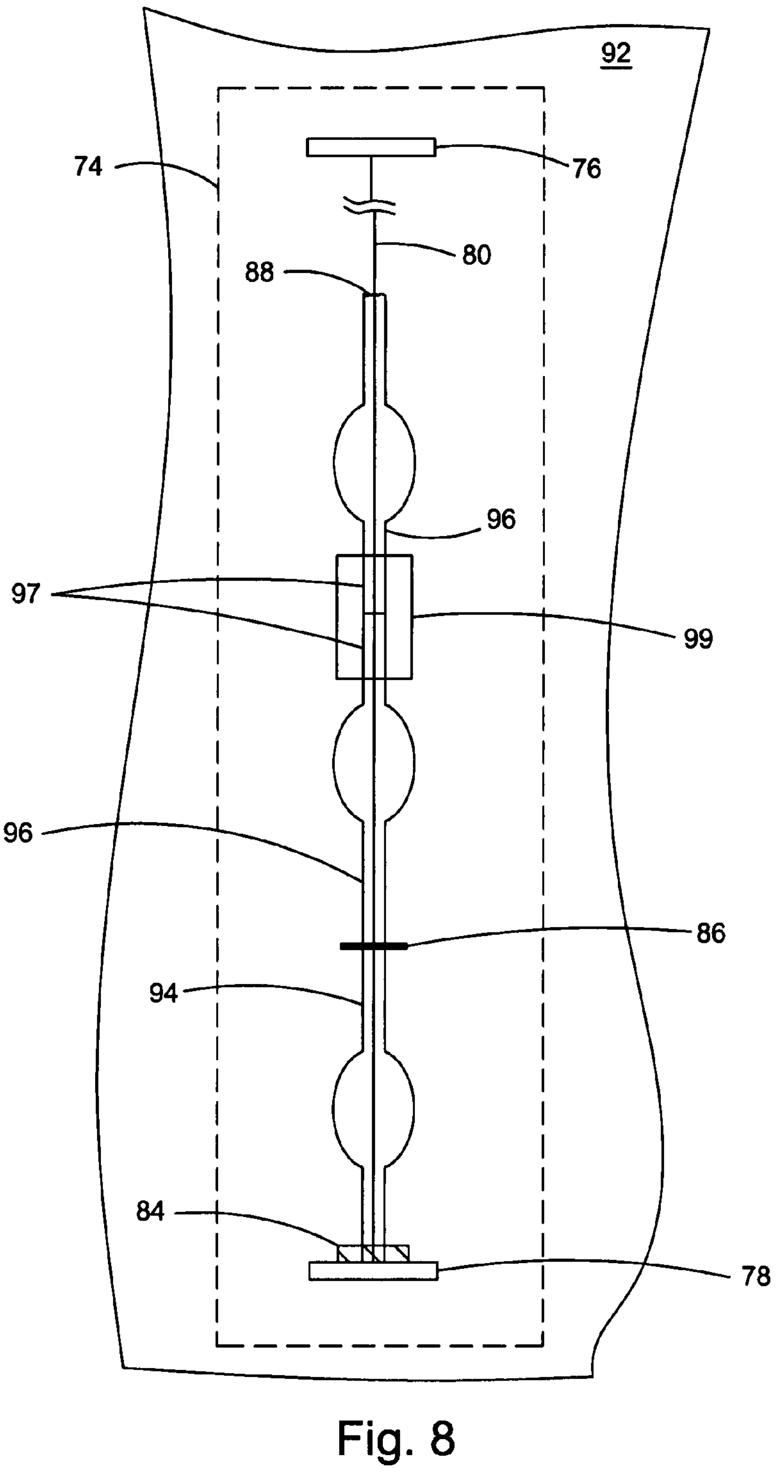
FIG. 8 is schematic representation of a portion a carrier of one embodiment of the coating apparatus of the present invention illustrating an axial rotation means having a plurality of lamp burner envelopes supported thereon.

As shown in the portion of the surface of a drum shown in FIG. 8, the axial rotation means 74 includes the rod 80 which is supported at each end on the portion of the carrier 92 by the supports 76,78. The rod 80 is an elongated generally rigid member which may have any shape cross-section but must have a cross-sectional dimension small enough so that the rod 80 will pass through the generally tubular lamp burner envelopes 14 supported thereon.

The lamp burner envelopes 14, integrally connected as shown in FIG. 1*a*, or separated as shown in FIG. 1*b*, may be mounted on the rotation means 74 by detaching the rod 80 from either support 76,78 and sliding the generally tubular burner envelopes 14 over the rod 80 so that the axis formed by the rod 80 is coincident with the longitudinal axis of the lamp burner envelopes 14 supported thereon.

In one embodiment, the lamp burner envelopes 94,96 may be supported on the rod 80 so that rotation of the rod 80 will rotate the lamp burner envelopes 94,96 supported thereon, i.e., there is no relative rotational motion between the rod and the lamp burner envelopes supported thereon.

In the embodiment of the present invention wherein the rod 80 is vertical, the lowest lamp burner envelope 94 supported by the rod 80 may be secured to the rod 80 by any suitable conventional means to prevent relative rotational motion between the rod 80 and the lamp burner envelope, and each of the remaining lamp burner envelopes 96 supported by the rod 80 will rotate with the lowest lamp burner envelope 94 due to frictional engagement with the underlying lamp burner envelope.

The means to prevent relative rotational motion between the rod 80 and the lowest lamp burner envelope 94 may be a mechanical clamp 84. Alternatively, the surface of the rod 80 may comprise a resilient material slightly compressed by the internal wall of the burner envelope 94 and remain in frictional engagement with the lowest, or all, of the burners.

The friction between the adjacent burner envelopes may be enhanced by placing a washer 86 of frictional material between the adjacent lamp burner envelopes, by causing the edges 88 of the lamp burner envelopes to be roughened, or by placing a resilient sleeve 99 over the adjacent end portions 97 of the lamp burner envelopes 96 to grip the ends of adjacent burners.

The uniform coating may also be formed on the integral section 10 before the section is cut to form the individual burner envelopes, and the coating may be patterned to leave uncoated space on the section between burner envelopes. Alternatively, the sleeve 99 may provide shielding.

As illustrated in FIGS. 6, 7, and 8, a single axial rotation means 74 may support and rotate a plurality of lamp burner envelopes 14 thus reducing the number of axial rotation means required to rotate each of the lamp burner envelopes in an array of lamp burner envelopes carried by the carrier. Thus the tooling required in the coating apparatus and the cost associated therewith is reduced. It also increases the density of the array in that the space consumed by the rotating means is materially reduced, and thus improves the throughput.

Figure 9A:
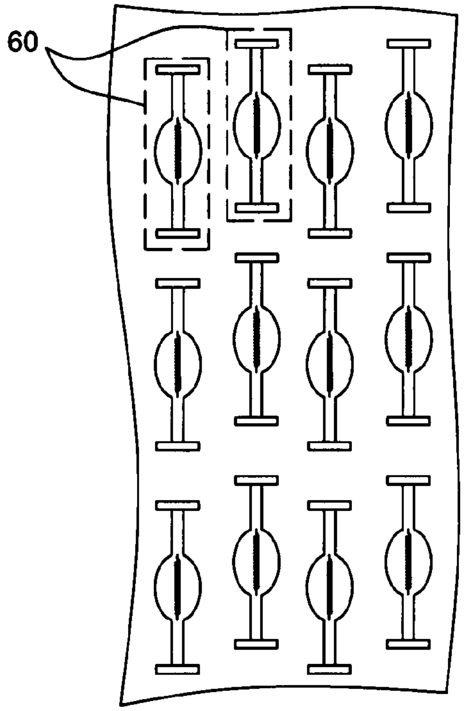
FIGS. 9*a* and 9*b* are schematic representations of cylindrical carriers of embodiments of the coating apparatus of the present invention illustrating a plurality of axial rotation means supported thereon having improved lateral spacing.
Figure 9B:
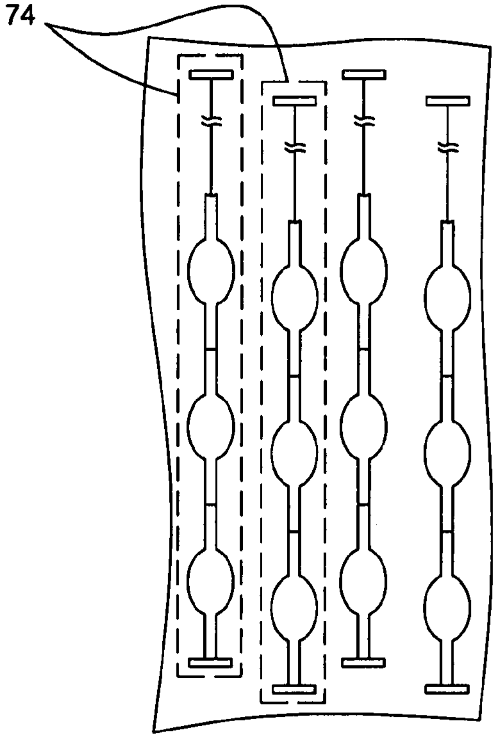

Throughput of the coating apparatus may be improved by reducing the lateral spacing between laterally adjacent rods. As shown in FIG. 9, the spacing between the laterally adjacent rotational means 60 illustrated in FIG. 5 may be reduced by offsetting the axial position of the laterally adjacent axial rotation means 60.

It is often desirable to prevent the deposition of the coating materials on selected portions of the surface to be coated. This may be achieved by masking the selected portions, i.e. providing a physical barrier to prevent the deposition of the coating material on the selected portions. The position of the physical barrier may be fixed relative to the position of the sources of the material to be deposited, or may be carried by the carrier in a position fixed relative to the position of the substrates.

Figure 10A:
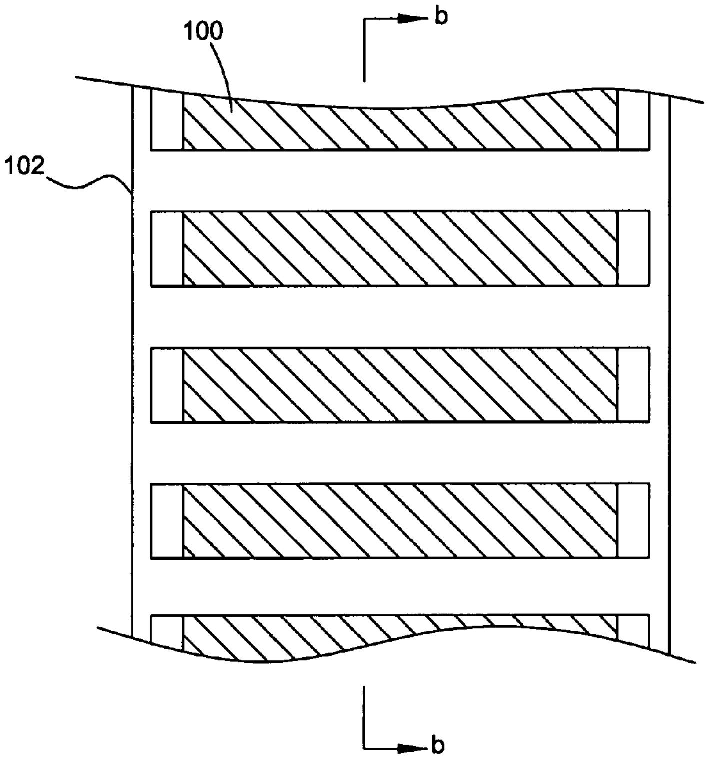
FIG. 10*a* is a schematic representation illustrating a target and mask of one embodiment of the coating apparatus of the present invention.
Figure 10B:
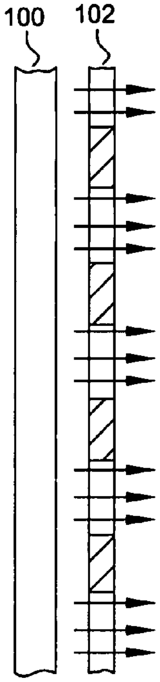
FIG. 10*b* is a section taken through line b—b of FIG. 10*a*.

As shown in FIG. 10, a section of the surface 100 of a sputtering target may be masked by a mask 102 fixed relative thereto by mounting on the target supporting structure. Alternatively, the mask may be carried by the carrier in a fixed position relative to the substrates being coated. In either event, the mask may be any mechanical barrier which prevents formation of the coating on the selected portions of the lamp burner envelopes. By way of example, with reference to FIG. 8, the resilient sleeve 99 provides a mask for the end portions 97 wherein the position of the sleeve 99 is fixed relative to the end portions 97 during the coating process.

Baking Processes:

Many coatings are formed by a reactive process, e.g., a silicon dioxide ($SiO_2$) coating may be formed by depositing silicon on the surface of the lamp burner envelope and reacting the silicon with oxygen to form the silica. In order to obtain the desired physical characteristics such as the optical qualities of the coating, it is often necessary to fully react the silicon deposited on the lamp burner envelope. Where the reaction process occurs during the deposition process, the rate of deposition of the silicon cannot exceed the reaction rate, i.e., each layer of the deposited silicon must be fully reacted before more silicon is deposited. The reaction between silicon and oxygen generally occurs more readily at higher temperatures, but the temperature of the deposition process is generally between about 25° C. and 125° C. and is limited to about 200° C. or below.

One known method of reducing the time required to form a coating of silicon dioxide deposits the silicon at a rate in excess of the rate at which all of the deposited silicon will be reacted, and then bakes the incompletely reacted coatings in a reactive atmosphere at a temperature above 200° C. Thus the completion of the reaction may be both accelerated and take place in an oven, freeing the coating apparatus for reuse.

This known method is not particularly advantageous in the manufacturing of lamps wherein the step of sealing is performed before the step of coating because the temperature at which the coated lamp burners may be baked must be limited to prevent undesirable oxidation of the electrical leads of the lamp burner. For example, the baking temperature of a lamp burner having tungsten and molybdenum electrical leads must be limited to less than about 400° C. in an atmosphere comprising essentially of normal dry air to prevent oxidation of the leads.

Where the coating step is performed before the sealing step, the coated lamp burner envelopes do not include the electrical leads and the temperature at which the coated lamp burner envelopes may be baked may exceed 400° C., and may be as high as 1200° C., in normal dry air which thereby reduces the time required for the bake.

However, it has been discovered that exposure of the coating to temperatures in excess of about 800° C. may deleteriously affect the physical characteristics of the coating or cause mechanical failure of the coating upon cooling to room temperature. Some of the deleterious affects on the coating resulting from exposure of the coating to such high temperatures and subsequent cooling of the coating are disclosed in U.S. Pat. No. 5,923,471 to Wood, II, et al. the contents of which is incorporated herein by reference. As suggested by the Wood, II, et al. patent, the baking process may be controlled depending on the specific materials comprising the coating to control the atomic structure of the coating materials.

In the method of baking coated lamp burner envelopes of the present invention, the baking may be performed in steps, i.e., the baking temperature may be raised to a predetermined temperature for a period of time and then the temperature may be further raised for a second period of time, and the steps repeated as necessary until the final baking temperature is reached. The "recipe" for the baking process is determined by the specific materials comprising the coating in order to control the atomic structure of the coating materials.

In still another aspect of the present invention, a method of baking coated lamp burners is provided wherein the coated lamp burners are baked in an essentially reactive gas (e.g., oxygen) free atmosphere, e.g., an inert gas such as argon or nitrogen. Where the lamp burners with electrical leads are baked in an atmosphere which is essentially free from oxygen, the temperature of the bake does not need to be limited to prevent oxidation of the electrical leads. Despite the lack of sufficient oxygen in the baking atmosphere to damage the electrodes, the reaction of the silicon may still be completed because of the unbonded oxygen dissolved in the coating.

Filament Positioning:

Where the coating is established before the sealing of the burner, the coating may facilitate the positioning of the filament relative to the lamp burner envelope. In a halogen lamp having an IRR coating formed on the surface of the lamp burner envelope, the heat reflected by the IRR coating increases the temperature of the filament if properly focused thereon and thus reduces the power necessary for proper lamp operation. Thus, the positioning of the filament relative to the lamp envelope is important. Optimally, the filament is positioned along the longitudinal axis of the lamp burner envelope.

The temperature of the lamp filament will rise due to the passage of electrical current therethrough and the amount of light emitted by the filament is proportional to the temperature of the filament. The degree by which the temperature of the filament is raised by the reflected infrared radiation may be used as an indication of the position of the filament relative to the lamp burner envelope.

Figure 15:
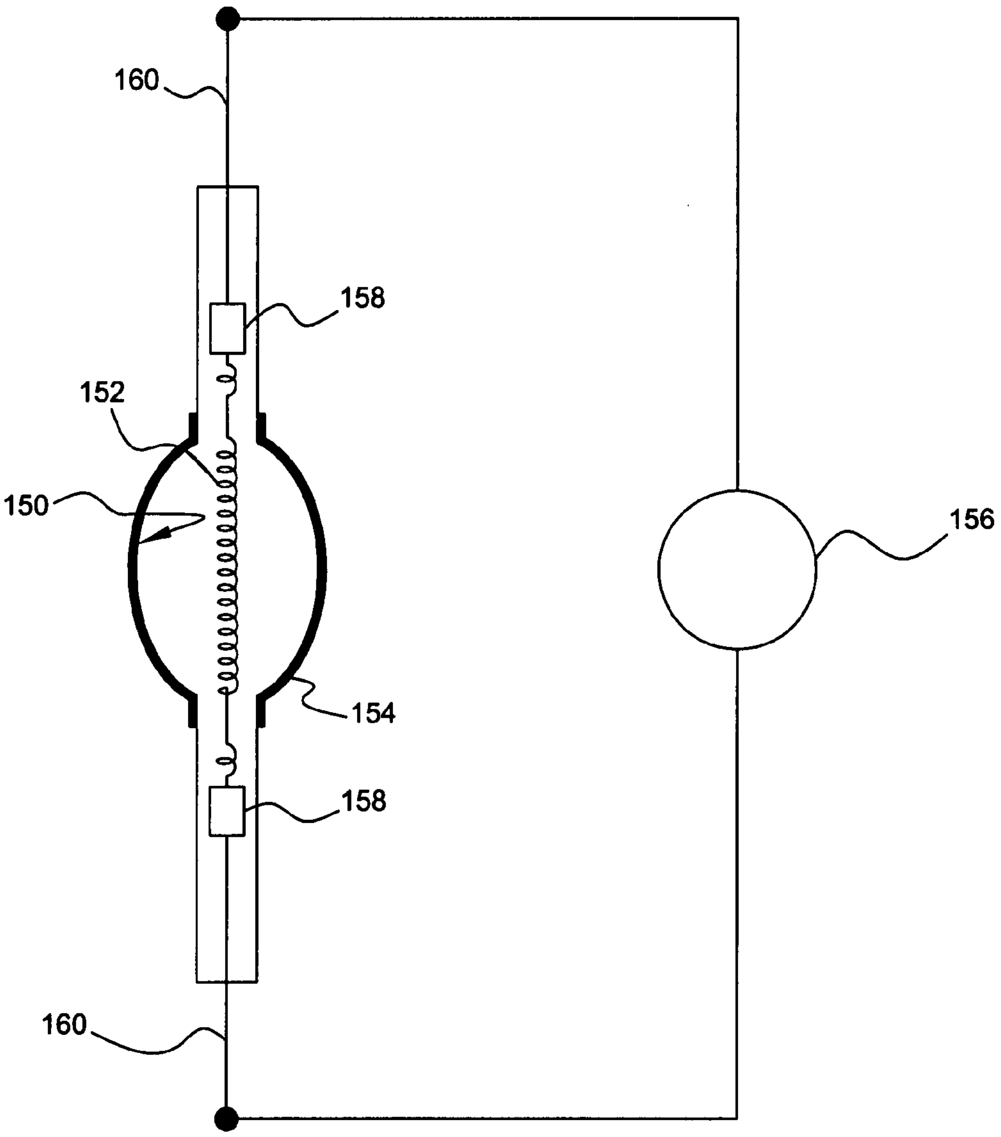
FIG. 15 is a schematic representation illustrating one embodiment of the present invention for determining the position of a filament relative to the coated burner envelope of a halogen lamp.

FIG. 15 illustrates one embodiment of the present invention for determining the optimum position of the filament relative to the lamp burner envelope in a halogen lamp. As shown in FIG. 15, the filament 152 is positioned within the halogen lamp burner envelope 150 having an IRR coating 154 formed on its exterior surface. The filament may be any material suitable for providing light when an electrical current is passed therethrough in a halogen lamp, typically tungsten. The filament 152 is electrically connected to a source of power through the foils 158 and the wires 160 passing through the unsealed burner envelope.

Because the IRR coating 154 has been previously formed on the lamp burner envelope 150, the optimum position of the filament 152 relative to the coated lamp burner envelope may be determined by measuring the power required to maintain the temperature of the filament constant while adjusting the position of the filament. The temperature of the filament in an operating halogen lamp is typically about 2900° C. The temperature of the filament during the alignment process may be much lower. For example, the temperature of the filament may be maintained at about 1500° C. during the alignment process.

The temperature of the filament may be measured by any conventional means such as an optical pyrometer. Alternatively, the temperature of the filament may be determined by measuring the resistance of the filament and determining the temperature using the known resistance/temperature relationship for the filament. Preferably, the optimum position of the filament relative to lamp burner envelope may be determined by:

a. positioning the filament relative to the burner envelope;

b. applying power to the filament;

b. measuring the temperature of the filament;

c. adjusting the power applied to the filament to attain a predetermined filament temperature;

d. changing the position of the filament relative to the burner envelope;

e. measuring the power applied to the filament;

f. adjusting the power applied to the filament to maintain the temperature of the filament at the predetermined filament temperature; and g. determining the optimum position of the filament relative to the burner envelope by repeating steps (b) to (f) as necessary to determine the position of the filament relative to the burner envelope wherein the minimum power is applied to the filament to maintain the filament at the predetermined filament temperature.

Once the optimum position of the filament is determined through the movement of the filament relative to the burner envelope, the filament may be held in that position while the lamp burner envelope is sealed.

Figure 11:
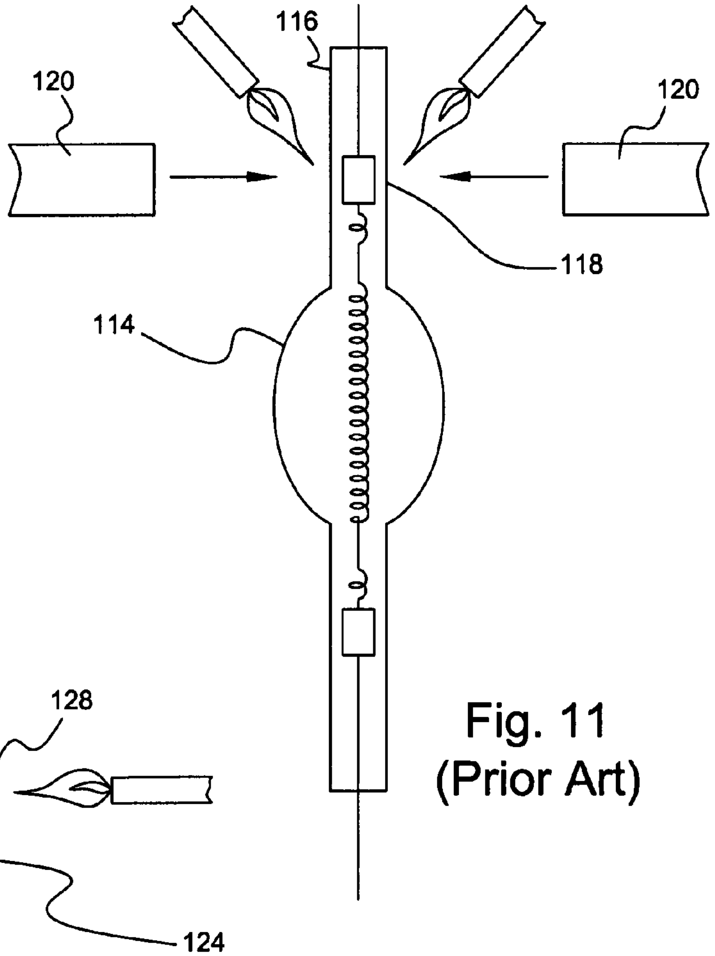
Fig. 11 (Prior Art)
FIG. 11 is a schematic representation illustrating a conventional pinch sealing process for glass or quartz glass lamp burner envelopes.

Protecting the Coating During the Seal:

FIG. 11 illustrates a conventional pinch sealing process for a glass or quartz glass lamp burner envelope where a selected portion 118 of the end portion 116 of the lamp burner envelope 114 is locally heated to temperatures between about 1700° C. and 2000° C. while collapsing the selected portion with the jaws 120 to form the hermetic seal.

Figure 12:
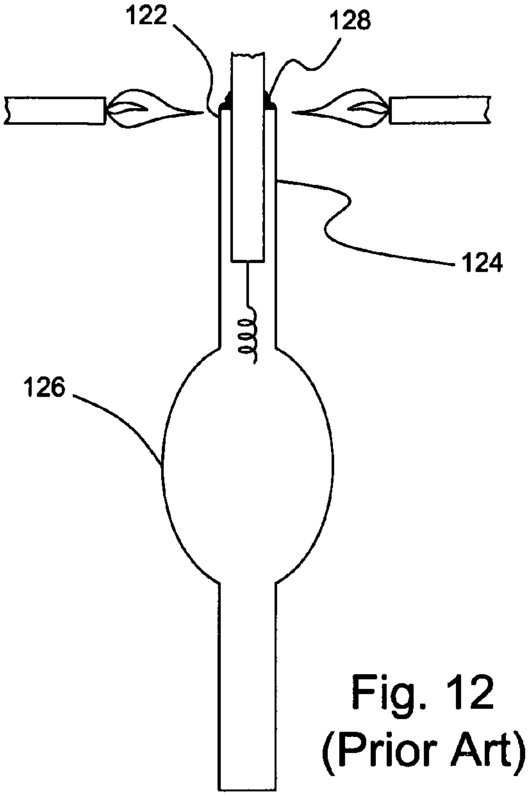
Fig. 12 (Prior Art)
FIG. 12 is a schematic representation illustrating a conventional frit sealing process for ceramic lamp burner envelopes.

FIG. 12 illustrates a conventional frit sealing process for a ceramic lamp burner envelope where a selected portion 122 of the end portion 124 of the lamp burner envelope 126 may be locally heated to temperatures of about 1700° C. in order to melt the frit material 128 to thereby "plug" the end portion of the lamp burner envelope when the frit material solidifies upon cooling to form a hermetic seal.

The coating applied to the surface of the lamp burner envelope may have a deleterious effect on the pinch seal process. For example, a heat reflective coating may interfere with the localized heating of the selected portions to be pinched. Thus it may be desirable to mask the selected portions during the coating process.

In the sealing process, the temperature of the portions to be sealed is raised to about 1700° C. or greater. The coating formed on the surface of the lamp burner envelope may be damaged if exposed to such high temperatures. Thus it may be important to shield the coating from the flame during the sealing process.

Figure 13:
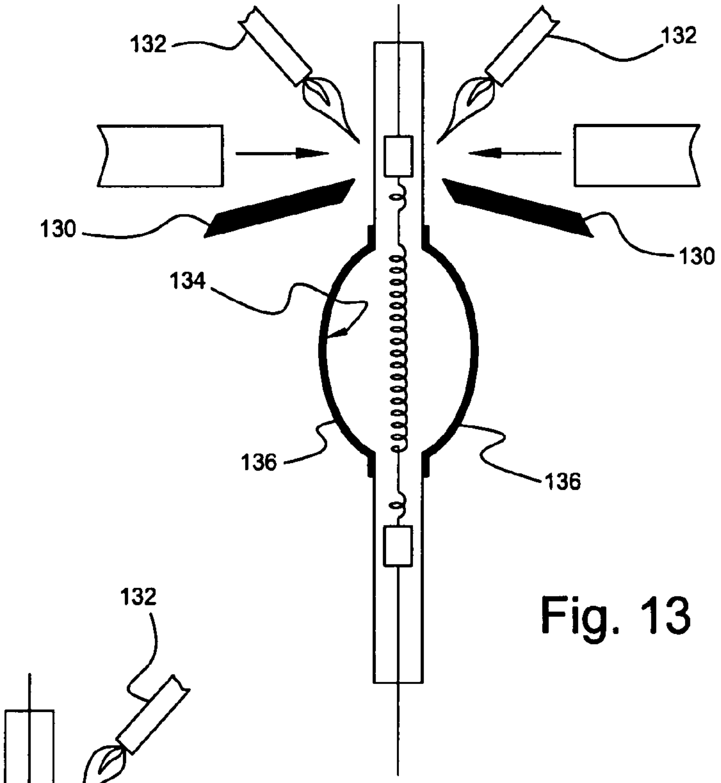
FIG. 13 is a schematic representation illustrating one embodiment of the heat reflective shield of the present invention for the pinch sealing process.
Figure 14:
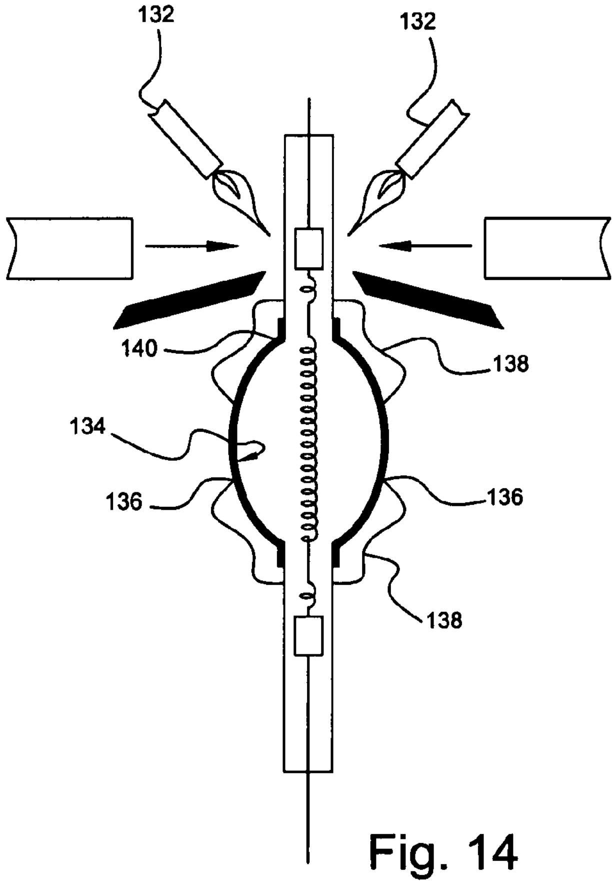
FIG. 14 is a schematic representation illustrating one embodiment of the heat reflective coating of the present invention for the pinch sealing process.

As shown in FIG. 13, a suitable conventional heat reflecting shield 130 may be provided between the heat sources 132 and the portions of the lamp burner envelope 134 having the coating 136 formed thereon. Alternatively as shown in FIG. 14, a suitable conventional heat reflective coating 138 such as alumina or zirconia may be formed on the portions of the lamp burner envelope 134 adjacent the selected portions 140 of the lamp burner envelope 134 to be heated. The coating 138 protects the area immediately adjacent the flame, and is not needed for more distant areas.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a method of assembling a lamp including the steps of:

forming a bulbous light emitting chamber intermediate tubular end portions from a lamp burner envelope;

sealing each of the tubular end portions with a respective heat source disposed proximate the bulbous light emitting chamber; and coating at least a portion of the surface of the bulbous light emitting chamber;

the improvement comprising the step of shielding the coated surface of the bulbous light emitting chamber from the heat source, whereby the step of coating is performed before the step of sealing without resulting in degradation to the performance of the coating.

2. The method of claim 1 wherein the burner envelope when completed as a lamp burner includes elements which would be damaged by baking in an oxygen containing atmosphere at temperatures greater than a certain temperature, the method further comprising the step of baking the coated burner envelope in an oxygen containing atmosphere at a temperature greater than the certain temperature.

3. The method of claim 2 where the baking temperature is greater than about 400° C.

4. The method of claim 2 wherein the step of baking the coated burner envelope comprises the steps of baking the burner envelope at a first baking temperature for a first baking period followed by the step of raising the baking temperature and baking the burner envelope for another period of time.

5. The method of claim 1 further comprising the step of baking the coated burner envelope in an essentially oxygen free atmosphere.

6. The method of claim 1 wherein portions of the lamp burner envelope are coated with a material which will be damaged if exposed to temperatures above a certain temperature and wherein the sealing is performed by exposing one or more uncoated portions of the burner envelope to temperatures above the certain temperature, the method further comprising the step of preventing the exposure of the coated portions of the burner envelope adjacent the uncoated portions exposed to such temperatures from temperatures above the certain temperature.

7. The method of claim 1 further comprising the step of aligning a filament in an IRR coated burner envelope including the step of determining the optimum position of the filament relative to the burner envelope by measuring the power applied to the filament to maintain a constant temperature of the filament.

8. The method of claim 1 wherein the burner envelope is formed from one or more of the materials from the group consisting of glass, quartz glass, and ceramics.

9. The method of claim 1 wherein the step of coating portions of the surface of the burner envelope includes the step of masking selected portions of the surface of the burner envelope so that the selected portions remain uncoated after the step of coating portions of the surface of the burner envelope.

10. The method of claim 1 further comprising the step of cutting a generally tubular section of light transmitting material to form one or more lamp burner envelopes wherein the step of coating is performed before the step of cutting the burner envelope.

11. A method of assembling a lamp comprising the ordered steps of:

a. providing a burner envelope of light-transmitting material forming a bulbous light emitting chamber intermediate tubular end portions;

b. coating the exterior surface of the burner envelope;

c. positioning one or more electrical leads so that each of the leads provides an electrical connection from internal of the light emitting chamber to external of the envelope;

d. shielding the coated surfaces from at least one heat source disposed proximate the bulbous light emitting chamber; and d. sealing the burner envelope by heating each of the tubular end portions with a respective one of said heat sources to hermetically seal the burner envelope to the leads to thereby seal the bulbous light emitting chamber intermediate tubular end portions.

12. The method of claim 1, wherein said bulbous light emitting chamber is substantially elliptical.

13. A method of depositing a layer of material on the exterior surface of a lamp burner envelope having a bulbous light emitting chamber intermediate tubular end portions which when completed as a lamp burner includes elements which would be damaged by baking at temperatures greater than a certain temperature, the method comprising the ordered steps of:

(a) depositing the layer of material;

(b) baking the burner envelope at temperatures greater than the certain temperature; and (c) shielding the deposited layer of material from at least one heat source disposed proximate the bulbous light emitting chamber; and (d) sealing portions of said elements into said lamp burner envelope by heating each of the tubular end portions with the at least one heat source to hermetically seal the burner envelope, whereby the protecting the deposited layer allows depositing the layer before the sealing, which allows the baking of the deposited layer of material without the presence of said elements.

14. The method of claim 13 wherein the certain temperature is about 400° C.

15. The method of claim 13 wherein the certain temperature is about 600° C.

16. The method of claim 13 wherein the certain temperature is about 1200° C.

17. The method of claim 13 comprising the steps of baking the burner envelope at a first baking temperature for a first baking period followed by the step of raising the baking temperature and baking for another period of time.

18. The method of claim 17 wherein the step of raising the baking temperature is repeated one of more times.

19. The method of claim 13 wherein the material is deposited in a sputter deposition process and the burner envelope is baked to oxidize the deposited material to form an optical interference coating.

20. In a process of hermetically sealing a lamp burner envelope having a bulbous light emitting chamber and having portions coated with a material which will be damaged if exposed to temperatures greater than a certain temperature wherein the sealing is performed by exposing one or more uncoated portions of the burner envelope to temperatures greater than the certain temperature, the step of shielding the exposure of the coated portions of the burner envelope to temperatures greater than the certain temperature.

21. The process of claim 20 wherein the step of shielding the exposure of the coated portions of the burner envelope includes the step of providing a heat reflective shield.

22. In a method of manufacturing an IRR coated lamp burner including the steps of (a) coating portions of the lamp burner envelope with a first coating which will be damaged if exposed to temperatures greater than a certain temperature and (b) sealing the envelope to form a bulbous light emitting chamber by exposing one or more uncoated end portions of the burner envelope to temperatures greater than the certain temperature, the step of coating the first coated portions adjacent the uncoated portions to be exposed to temperatures greater than the certain temperature with a second coating which both (i) shields the first coating from exposure to temperatures greater than the certain temperature during the sealing process and (ii) reduces the loss of infrared radiation through the end portions during operation of the lamp.

23. A method of making a lamp burner comprising a bulbous light emitting chamber intermediate sealed tubular end portions, said method comprising the steps of:

forming at least one bulbous portion in an elongate tubular envelope;

coating at least a portion of the exterior surface of said bulbous portion;

cutting said elongate tubular envelope to form at least one bulbous light emitting chamber intermediate tubular end portions wherein the step of coating is performed before the step of cutting;

shielding said coated surface from at least one heat source disposed proximate to the bulbous light emitting chamber;

hermetically sealing each of the tubular end portions using at least one respective heat source, whereby the step of protecting the coated surface allows the step of coating to occur before the step of sealing without damage to the coated surface, whereby the step of coating may then also be performed before the step of cutting, thereby increasing the rate of lamp burner production.

24. The method of claim 23 wherein the elongate tubular envelope comprises light transmitting material.

25. The method of claim 24 wherein the step of coating includes the step of baking the coated surface.

26. A method of assembling a lamp comprising the steps of:

a. providing a burner envelope of light-transmitting material forming an internal light emitting chamber;

b. coating the exterior surface of the burner envelope;

c. positioning a filament within the coated burner envelope;

d. positioning one or more electrical leads so that each of the leads provides an electrical connection from the filament internal of the light emitting chamber to external of the envelope;

e. applying power to the filament via the electrical leads;

f. repositioning the filament to a position requiring the lowest applied power to maintain the filament at a constant temperature; and g. sealing the burner envelope to hermetically seal the burner envelope to the leads to thereby seal the light emitting chamber and fix the position of the filament.

27. In a process of hermetically sealing each tubular end portion of a double ended lamp burner envelope having a substantially elliptical bulbous light emitting chamber and having portions coated with an IR reflective material which will be damaged if exposed to temperatures greater than a certain temperature, wherein the chamber is sealed by pinch sealing each end portion during which pinch sealing process the end portions are exposed to temperatures greater than the certain temperature, the step of shielding portions of the IR reflective coating to thereby prevent exposure of the coated portions of the burner envelope to temperatures greater than the certain temperature.

28. A method of making a lamp comprising the steps of:

coating a lamp burner envelope comprising a bulbous light emitting chamber intermediate tubular end portions;

positioning one or more electrical leads in the tubular end portions of the coated lamp burner envelope;

pinch sealing one of the tubular end portions while shielding the portion of the bulbous chamber adjacent the tubular end portion to thereby prevent exposure of the coating thereon from temperatures that would damage the coating.

* * * * *